United States Patent
Chen et al.

(10) Patent No.: US 9,496,036 B1
(45) Date of Patent: Nov. 15, 2016

(54) WRITING METHOD FOR RESISTIVE MEMORY CELL AND RESISTIVE MEMORY

(71) Applicant: Winbond Electronics Corp., Taichung (TW)

(72) Inventors: Frederick Chen, Taichung (TW);
Ping-Kun Wang, Taichung (TW);
Shao-Ching Liao, Taichung (TW);
Pei-Hsiang Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/953,447

(22) Filed: Nov. 30, 2015

(51) Int. Cl.
*G11C 11/00* (2006.01)
*G11C 13/00* (2006.01)
*G11C 11/16* (2006.01)

(52) U.S. Cl.
CPC ....... *G11C 13/0097* (2013.01); *G11C 11/1653* (2013.01); *G11C 11/1655* (2013.01); *G11C 11/1657* (2013.01); *G11C 13/0069* (2013.01)

(58) Field of Classification Search
CPC .......... G11C 11/1653; G11C 11/1655; G11C 11/1657; G11C 11/1673
USPC ................ 365/158, 230.06, 189.15
See application file for complete search history.

(56) References Cited

U.S. PATENT DOCUMENTS

| | | | |
|---|---|---|---|
| 7,691,702 B2 | 4/2010 | Kapoor | |
| 8,048,755 B2 * | 11/2011 | Sandhu | H01L 45/085 257/536 |
| 8,315,079 B2 * | 11/2012 | Kuo | G11C 7/18 365/148 |
| 8,811,059 B2 * | 8/2014 | Rho | G11C 13/0026 365/104 |
| 9,047,966 B2 * | 6/2015 | Lee | G11C 7/1054 |
| 9,112,138 B2 * | 8/2015 | Ramaswamy | |
| 9,330,743 B2 * | 5/2016 | Kim | G11C 11/16 |

* cited by examiner

*Primary Examiner* — Pho M Luu
(74) *Attorney, Agent, or Firm* — Jianq Chyun IP Office

(57) ABSTRACT

A writing method for a resistive memory cell and a resistive memory are provided. The writing method includes following steps. A reference voltage is provided to a bit line of the resistive memory cell. A first voltage is provided to a word line of the resistive memory cell, and a second voltage is provided to a source line of the resistive memory cell, wherein the first voltage is not increased while the second voltage is progressively increased. Thus, when the writing method for the resistive memory cell is performed, the voltage of the word line is not increased while the voltage of the source line is progressively increased, so as to expand voltage window for reset operation. And, the chance for occurring the complementary switching manifestation of the resistive memory cell due to excessive input voltages is reduced.

13 Claims, 7 Drawing Sheets

WRITING METHOD FOR RESISTIVE MEMORY CELL AND RESISTIVE MEMORY

BACKGROUND OF THE INVENTION

1. Field of the Invention

The invention relates to a resistive memory technology, and more particularly relates to a writing method for a resistive memory cell and using the writing method for the resistive memory.

2. Description of Related Art

The resistive random-access memory (RRAM) is a new type of non-volatile memory which can use the changing of resistance state to memorize or to store numerical values. The resistive memory is excellently compatible with the logic manufacturing process, and has a fast write speed and a lower write voltage to meet the low power consumption requirement of the portable electronic products.

In the resistive memory, the three operations: forming operation, set operation, and reset operation are three important steps to ensure the electrical property and the data retention of the resistive memory cell. When performing the set/reset operation, the input voltage needs being progressively increased many times to finish the operation. However, when high input voltage is used to perform the set operation or the reset operation of the resistive memory cell, it may need decreasing the current which is originally corresponding to the high-current state of the resistive memory cell, or it may need increasing the current which is corresponding to the low-current state of the resistive memory cell, this phenomenon is called complementary switching manifestation. The complementary switching manifestation is a unique phenomenon in the field of resistive memory. In other words, an insufficient input voltage can cause the failure of the set operation and the reset operation, and an excessive operating voltage also generate a similar result. Therefore, how to prevent the input voltage in the process of progressively increasing from making the resistive memory cell generate the complementary switching manifestation because of the excessive voltage when performing the set operation and the reset operation is an important topic.

SUMMARY OF THE INVENTION

The invention provides a writing method for a resistive memory cell and using the writing method for a resistive memory can expand voltage window for reset operation, so as to reduce the chance for occurring the complementary switching manifestation due to excessive input voltages.

The writing method for the resistive memory cell in the invention includes following steps: providing a reference voltage to a bit line of the resistive memory cell. In addition, providing a first voltage to a word line of the resistive memory cell, and providing a second voltage to a source line of the resistive memory cell, wherein the first voltage is not increased while the second voltage is progressively increased.

In one embodiment of the invention, the first voltage is a constant voltage.

In one embodiment of the invention, the first voltage is decreased while the second voltage is progressively increased.

In one embodiment of the invention, the sum value of the first voltage and the second voltage is a constant value.

In one embodiment of the invention, the starting value of the second voltage is 2V or 0V.

In one embodiment of the invention, the starting value of the first voltage is the maximum voltage value that the resistive memory cell can receive.

In one embodiment of the invention, the writing method is a data reset method of the resistive memory cell.

The resistive memory in the invention includes at least one resistive memory cell, a word line signal providing circuit, a bit line signal providing circuit, and a source line signal providing circuit. The word line signal providing circuit is coupled to a word line of the resistive memory cell. The bit line signal providing circuit is coupled to a bit line of the resistive memory cell. The source line signal providing circuit is coupled to a source line of the resistive memory cell. The bit line signal providing circuit provides a reference voltage to the bit line of the at least one resistive memory cell, the word line signal providing circuit provides a first voltage to the word line of the at least one resistive memory cell, and the source line signal providing circuit provides a second voltage to the source line of the at least one resistive memory cell when the resistive memory cell performs a reset operation. The first voltage is not increased while the second voltage is progressively increased.

Based on the above, when performing the writing operation for the resistive memory cell (such as the reset operation), the voltage of the word line is not increased while the voltage of the source line is progressively increased, so as to make the conducting level of the switching unit of the resistive memory cell as a constant, or the conducting level of the switching unit is decreased because the voltage of the source line is progressively increased, so as to inhibit the voltage of the source line. Hence, the writing method can expand voltage window for reset operation, so as to reduce the chance for occurring the complementary switching manifestation due to excessive input voltages.

In order to make the aforementioned and other features and advantages of the invention more comprehensible, embodiments accompanying figures are described in detail belows.

DESCRIPTION OF THE EMBODIMENTS

Figure 1:
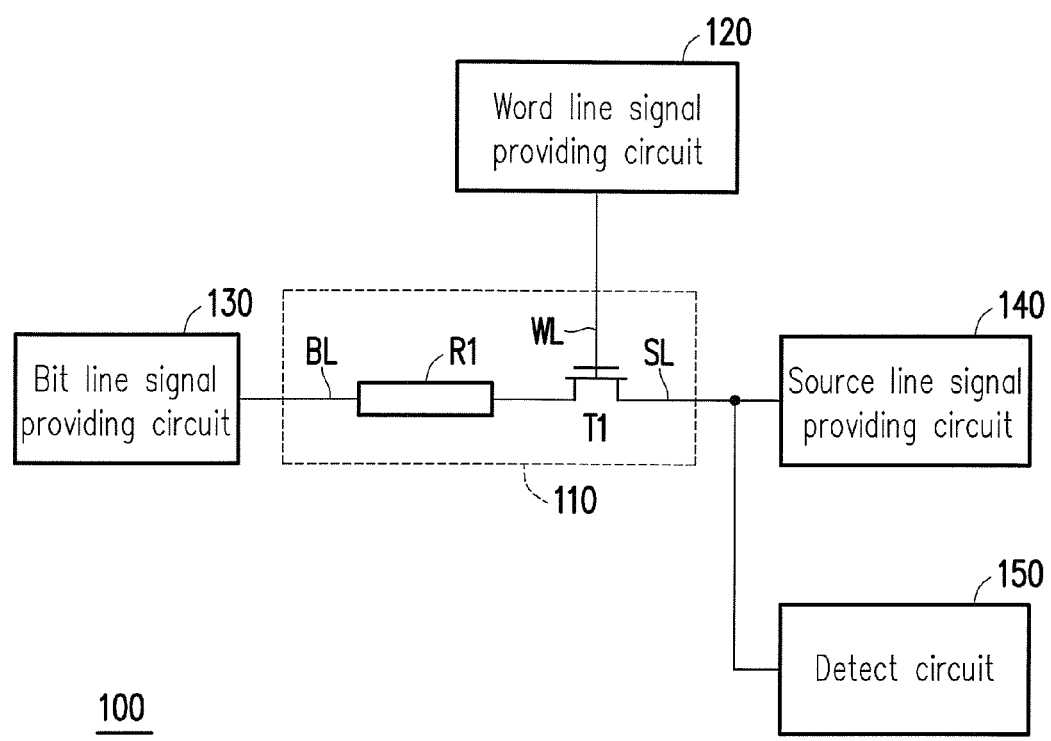
FIG. 1 is a block diagram depicting a resistive memory in one embodiment of the invention.

FIG. 1 is a block diagram depicting a resistive memory 100 in one embodiment of the invention. Referring to FIG. 1, the resistive memory 100 includes a resistive memory cell 110, a word line signal providing circuit 120, a bit line signal providing circuit 130, and a source line signal providing circuit 140. In the embodiment, the resistive memory cell 110 includes a switching unit (such as a transistor T1) and a resistor R1. The resistor R1 can be actualized by a transition metal oxide layer, the embodiments of the invention are not limited thereto. The first terminal of the resistor R1 is a bit line BL, the second terminal of the resistor R1 is mutually coupled to the first terminal of the transistor T1. The second terminal of the transistor T1 is a source line SL. The word line signal providing circuit 120 is coupled to the control terminal of the transistor T1 of the resistive memory cell 110, and the control terminal of the transistor T1 can be called as a word line WL of the resistive memory cell 110. The bit line signal providing circuit 130 is coupled to the bit line BL of the resistive memory cell 110. The source line signal providing circuit 140 is coupled to the source line SL of the resistive memory cell 110. The resistive memory 100 further includes a detect circuit 150 which detects the current of the resistive memory cell 110, so as to determine whether the writing operations (such as the forming operation, the set operation, or the reset operation) is completed or not.

Figure 2:
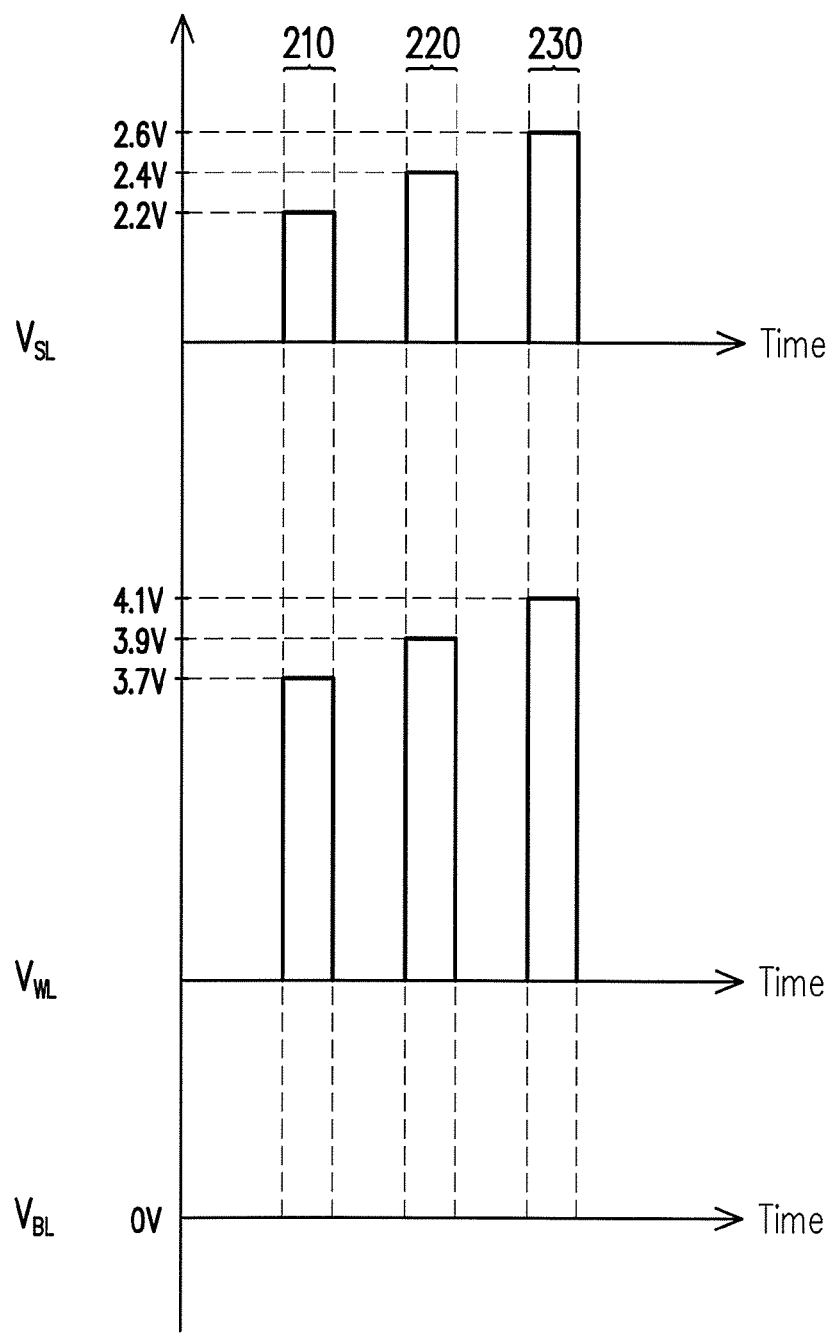
FIG. 2 is a schematic diagram depicting a waveform of a writing method for the resistive memory cell.

FIG. 2 is a schematic diagram depicting a waveform of a writing method for the resistive memory cell 110. Referring to FIG. 1 and FIG. 2, when the resistive memory cell 110 needs to perform the reset operation, the bit line signal providing circuit 130 can provide a reference voltage (such as a grounding voltage (0V)) to the bit line BL of the resistive memory cell 110. In other words, the voltage $V_{BL}$ of the bit line BL is equal to a 0V reference voltage. The word line signal providing circuit 120 provides a first voltage $V_{WL}$ (such as 3.7V voltage) to the word line WL of the resistive memory cell 110, and the source line signal providing circuit 140 provides a second voltage $V_{SL}$ (such as 2.2V voltage) to the source line SL of the resistive memory cell 110, as the voltage waveform depicted by the time interval 210 in FIG. 2. After that, in between the time interval 210 and the time interval 220, the resistive memory 100 detects whether the current in the resistive memory cell 110 is lower than a predefined current value via the detect circuit 150. The predefined current value can be adjusted according to the material of the resistor R1 and the requirement of the reset operation, the predefined current value of the embodiment in the invention is 3 µA. If the current in the resistive memory cell 110 is lower than the predefined current value, the reset operation of the resistive memory cell 110 will be completed.

In contrast, if the current in the resistive memory cell 110 is not lower than the predefined current value (3 µA), the reset operation of the resistive memory cell 110 will not be completed. Therefore, the first voltage $V_{WL}$ and the second voltage $V_{SL}$ are progressively increased, and the first voltage $V_{WL}$ and the second voltage $V_{SL}$ are provided to the word line WL and the source line SL via the word line signal providing circuit 120 and the source line signal providing circuit 140 respectively. As the voltage waveform depicted by the time interval 220 in FIG. 2, the word line signal providing circuit 120 provides a 3.9V first voltage $V_{WL}$ to the word line WL of the resistive memory cell 110, and the source line signal providing circuit 140 provides a 2.4V second voltage $V_{SL}$ to the source line SL of the resistive memory cell 110. In between the time interval 220 and the time interval 230, the current in the resistive memory cell 110 is detected whether to be lower than the predefined current value via the detect circuit 150. If the current in the resistive memory cell 110 is still not lower than the predefined current value, as shown by the voltage waveform depicted by the time interval 230, a 4.1V first voltage $V_{WL}$ is provided to the word line WL of the resistive memory cell 110, and a 2.6V second voltage $V_{SL}$ is provided to the source line SL of the resistive memory cell 110.

However, the first voltage $V_{WL}$ and the second voltage $V_{SL}$ of the reset operation described in FIG. 2 cannot be progressively increased unlimitedly because the excessive first voltage $V_{WL}$ is larger than $V_{SL}$ and will eventually hit an upper limit from the power supply or transistor gate oxide damage, and the excessive second voltage $V_{SL}$ makes the resistive memory cell 110 generate the complementary switching manifestation. Thus, in the embodiment of the invention, providing the first voltage $V_{WL}$ of the word line WL that is not increased while the second voltage $V_{SL}$ of the source line SL is progressively increased can reduce the chance for occurring the complementary switching manifestation of the resistive memory cell due to excessive input voltage. To be more specific, when the resistive memory cell 110 performs the writing operation (especially the reset operation) and the second voltage $V_{SL}$ of the source line SL is progressively increased in the embodiment of the invention, the first voltage $V_{WL}$ of the word line WL is maintained as a constant value, so as to maintain the conducting level of the switching unit of the resistive memory cell 110 as fixed; or, the first voltage $V_{WL}$ of the word line WL is decreased while the second voltage $V_{SL}$ of the source line SL is progressively increased, so as to make the conducting level of the switching unit decrease because the second voltage $V_{SL}$ of the source line SL is progressively increased. Hence, the writing method can expand voltage window for reset operation, so as to reduce the chance for occurring the complementary switching manifestation due to excessive input voltages. In other words, the conducting level of the switching unit is decreased because the second voltage $V_{SL}$ is progressively increased, so as to make the value of the second voltage $V_{SL}$ increase beyond the value that the complementary switching manifestation is possibly generated, and thus to extend voltage window of the second voltage $V_{SL}$.

Figure 3:
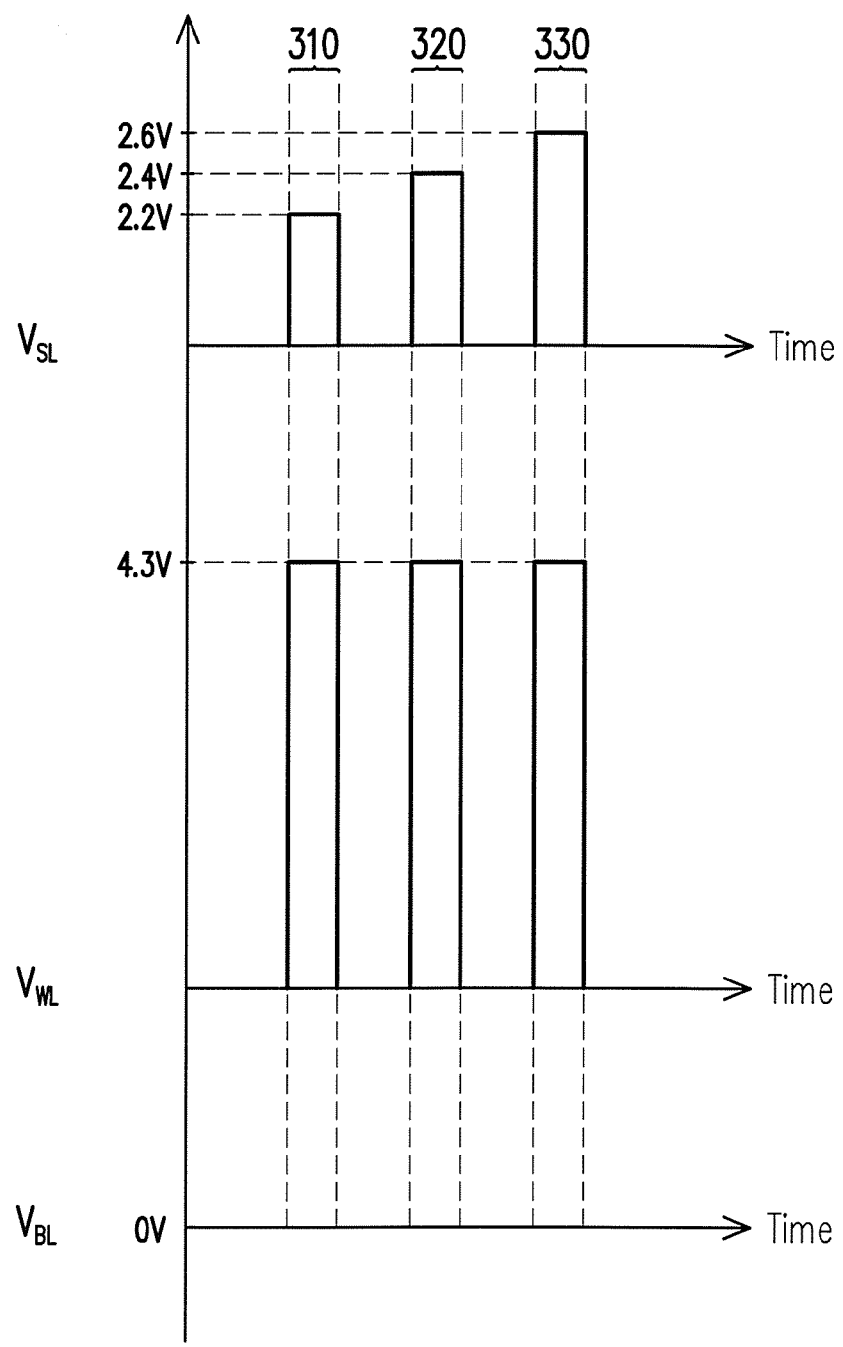
FIG. 3 is a schematic diagram depicting a waveform of a writing method for a resistive memory cell in one embodiment of the invention.

FIG. 3 is a schematic diagram depicting a waveform of a writing method for the resistive memory cell 110 in one embodiment of the invention. Referring to FIG. 1 and FIG. 3, when the resistive memory cell 110 needs performing the reset operation, the bit line signal providing circuit 130 similarly provide a reference voltage (such as a grounding voltage (0V)) to the bit line BL of the resistive memory cell 110. In the time intervals 310, 320, and 330, the source line signal providing circuit 140 increases the second voltage $V_{SL}$ progressively (for example, the second voltage $V_{SL}$ is 2.2V, 2.4V, and 2.6V) and provides the second voltage $V_{SL}$ to the source line SL of the resistive memory cell 110. The word line signal providing circuit 120 in the time intervals 310, 320, and 330 provides a constant first voltage $V_{WL}$ (such as a 4.3V voltage) to the word line WL, so that the conducting level of the switching unit (the transistor of T1) of the resistive memory cell 110 is maintained as a constant. The starting value of the first voltage $V_{WL}$ in the present embodiment is the maximum voltage value that the transistor T1 of the resistive memory cell 110 can receive.

Figure 4:
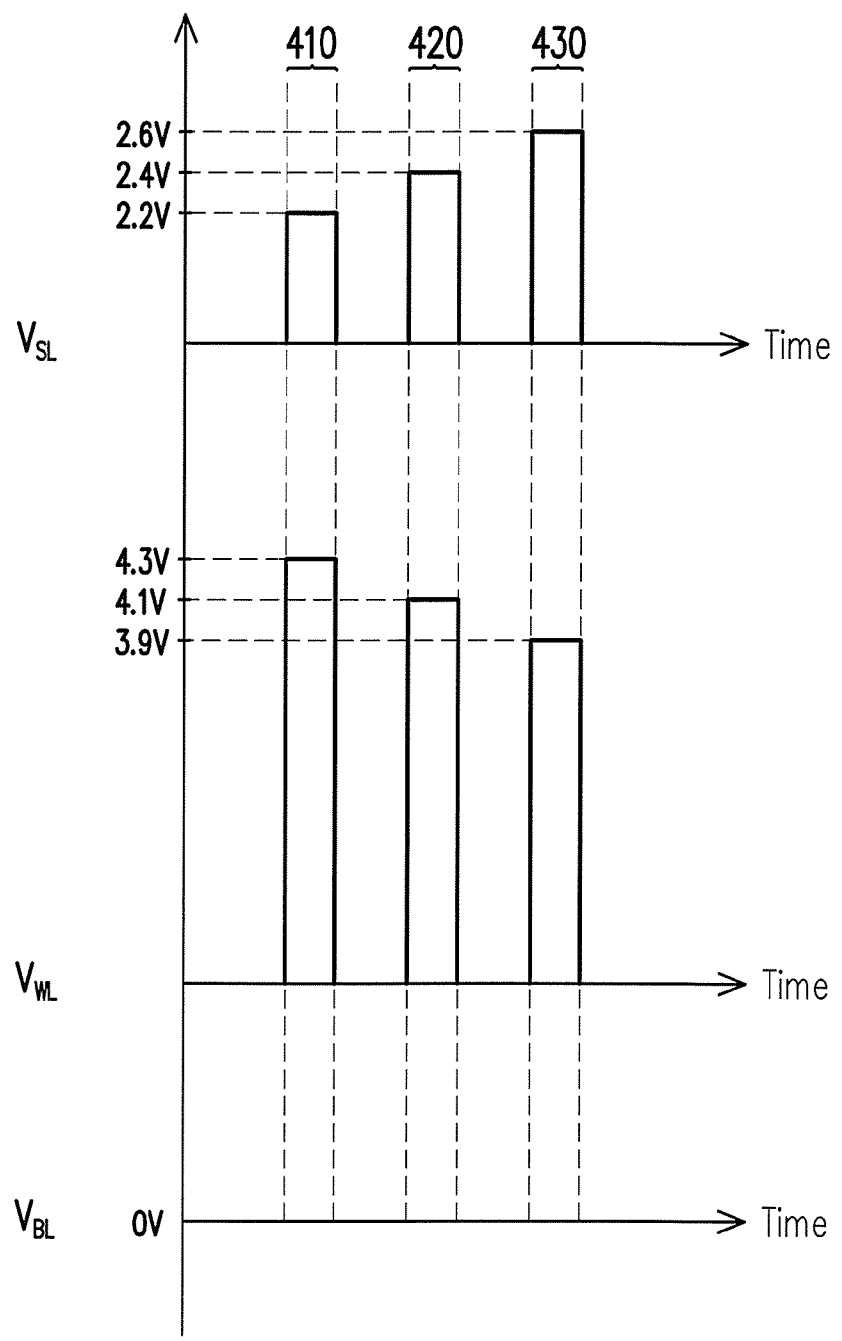
FIG. 4 is a schematic diagram depicting a waveform of a writing method for a resistive memory cell in the second embodiment of the invention.

FIG. 4 is a schematic diagram depicting a waveform of a writing method for the resistive memory cell 110 in the second embodiment of the invention. Referring to FIG. 1 and FIG. 4, when the resistive memory cell 110 needs performing the reset operation, the bit line signal providing circuit 130 similarly provide a reference voltage (such as a grounding voltage (0V)) to the bit line BL of the resistive memory cell 110. In the time intervals 410, 420, and 430, the source line signal providing circuit 140 increases the second voltage $V_{SL}$ progressively (for example, the second voltage $V_{SL}$ is 2.2V, 2.4V, and 2.6V) and provides the second voltage $V_{SL}$ to the source line SL of the resistive memory cell 110. The voltage of the word line signal providing circuit 120 is decreased because the second voltage $V_{SL}$ is progressively increased, for example, in the time intervals 410, 420, and 430, the 4.3 V, 4.1V, and 3.9V first voltages $V_{WL}$ are respectively provided to the word line WL of the resistive memory cell 110 to make the conducting level of the switching unit (the transistor T1) decrease because the second voltage $V_{SL}$ of the source line SL is progressively increased. The starting value (4.3V) of the first voltage $V_{WL}$ in the present embodiment can also be the maximum voltage value that the transistor T1 of the resistive memory cell 110 can receive.

The source line signal providing circuit 140 in the embodiment can increase the second voltage $V_{SL}$ by 0.2V each time. In the present embodiment, the source line signal providing circuit 140 can set the starting value of the second voltage $V_{SL}$ to begin to increase progressively from 0V, but it may need spending more time to perform the reset operation of the resistive memory cell 110. The source line signal providing circuit 140 can also set the starting value of the second voltage $V_{SL}$ to begin to increase progressively from 2V, so as to shorten the time performing the reset operation of the resistive memory cell 110. It is known from experience that when the sum value of the first voltage $V_{WL}$ and the second voltage $V_{SL}$ is a constant value (such as the sum value of the first voltage $V_{WL}$ and the second voltage $V_{SL}$ is 6.5), the resistive memory cell 110 has a preferred reset operation.

Figure 5:
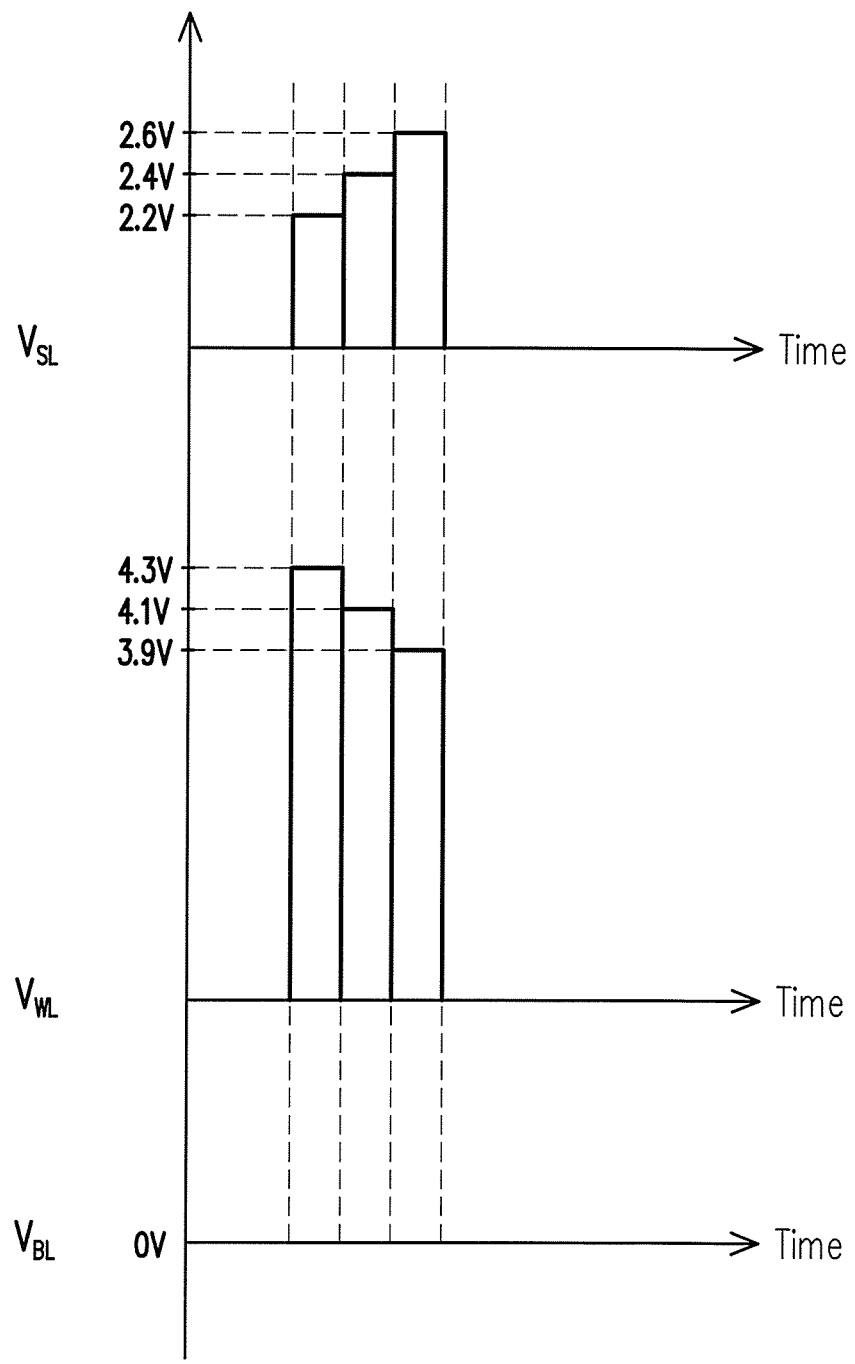
FIG. 5 and FIG. 6 are schematic diagrams depicting a waveform of a writing method for a resistive memory cell in the third and the fourth embodiment of the invention respectively.
Figure 6:
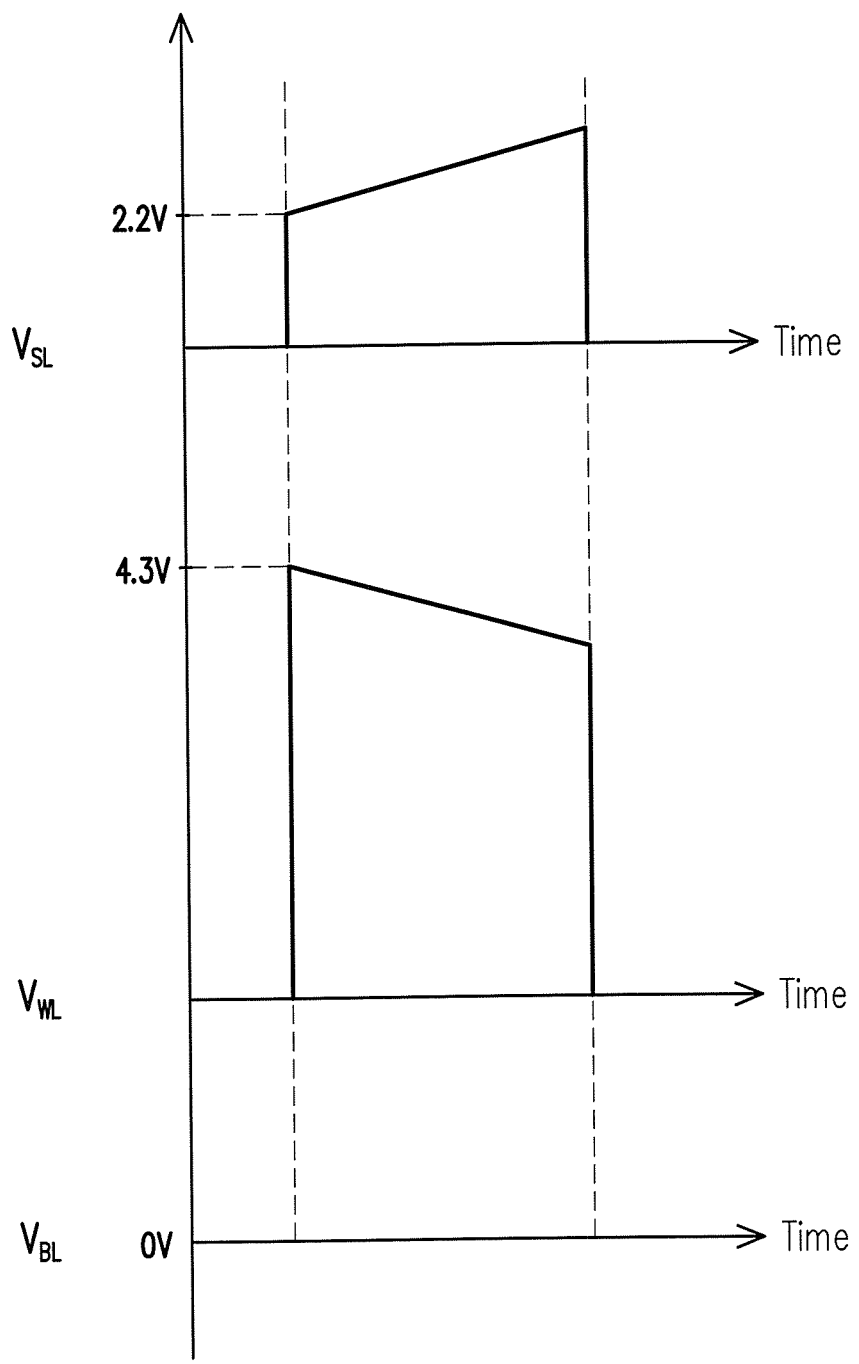
Figure 7:
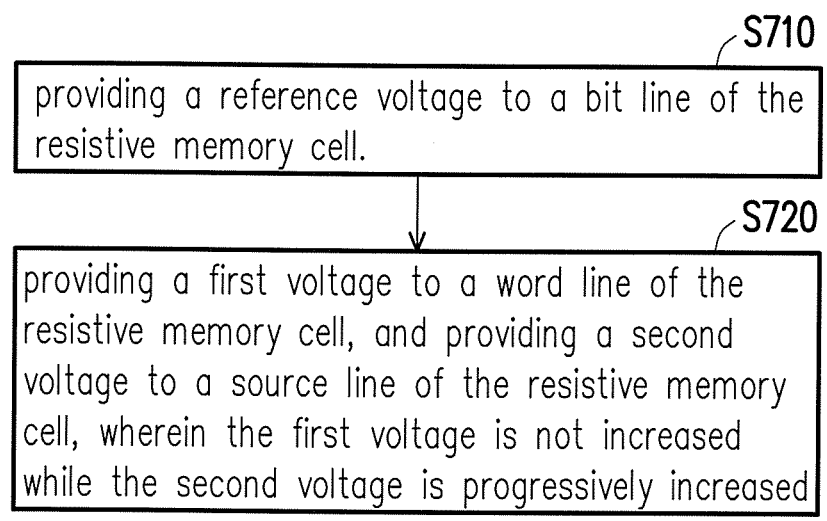
FIG. 7 is a flow diagram depicting a waveform of a writing method for a resistive memory cell in one embodiment of the invention.

FIG. 5 and FIG. 6 are schematic diagrams depicting a waveform of a writing method for a resistive memory cell in the third and the fourth embodiment of the invention respectively. The difference between the second embodiment in FIG. 4 and the third embodiment in FIG. 5 is that the resistive memory in FIG. 5 can simultaneously detect the current of the resistive memory cell when performing the writing operation for the resistive memory cell, and therefore there is no need to reserve a time interval in the time axis for detecting the current of the resistive memory cell. The difference between the second embodiment in FIG. 4 and the fourth embodiment in FIG. 6 is that the resistive memory in FIG. 6 can continuously transmit the first voltage $V_{WL}$ and the second voltage $V_{SL}$ to the word line WL and the source line SL of the resistive memory cell, the sum of the first voltage $V_{WL}$ and the second voltage $V_{SL}$ is 6.5V. FIG. 7 is a flow diagram depicting a waveform of a writing method for a resistive memory cell in one embodiment of the invention. Referring to FIG. 1 and FIG. 7, in StepS710, when the resistive memory cell 110 performs the reset operation, the bit line signal providing circuit 130 provides a reference voltage to the bit line BL of the resistive memory cell 110. In StepS720, the word line signal providing circuit 120 provides a first voltage $V_{WL}$ to the word line WL of the resistive memory cell 110, and the source line signal providing circuit 140 provides a second voltage $V_{SL}$ to the source line SL of the resistive memory cell 110, wherein the first voltage $V_{WL}$ is not increased while the second voltage $V_{SL}$ is progressively increased. The detail process of the Steps in FIG. 7 can reference the above-mentioned embodiments.

In summary, when performing the writing operation for the resistive memory cell (such as the reset operation), the voltage of the source line is not increased while the voltage of the source line is progressively increased, so as to make the conducting level of the switching unit of the resistive memory cell as a constant, or the conducting level of the switching unit is decreased because the voltage of the source line is progressively increased, so as to inhibit the voltage of the source line. Hence, the writing method can expand voltage window for reset operation, so as to reduce the chance for occurring the complementary switching manifestation due to excessive input voltages.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A writing method for a resistive memory cell, comprising:
   providing a reference voltage to a bit line of the resistive memory cell; and
   providing a first voltage to a word line of the resistive memory cell, and providing a second voltage to a source line of the resistive memory cell, wherein the first voltage is not increased while the second voltage is progressively increased when the resistive memory cell performs a reset operation.

2. The writing method for the resistive memory cell as recited in claim 1, wherein the first voltage is a constant voltage.

3. The writing method for the resistive memory cell as recited in claim 1, wherein the first voltage is decreased while the second voltage is progressively increased.

4. The writing method for the resistive memory cell as recited in claim 1, wherein a sum value of the first voltage and the second voltage is a constant value.

5. The writing method for the resistive memory cell as recited in claim 1, wherein a starting value of the second voltage is 2V or 0V.

6. The writing method for the resistive memory cell as recited in claim 1, wherein a starting value of the first voltage is a maximum voltage value that the resistive memory cell can receive.

7. The writing method for the resistive memory cell as recited in claim 6, wherein the starting value of the first voltage is 4.3V.

8. The writing method for the resistive memory cell as recited in claim 1, wherein the writing method is a data reset method of the resistive memory cell.

9. A resistive memory, comprising:
   at least one resistive memory cell;
   a word line signal providing circuit, coupled to a word line of the resistive memory cell;
   a bit line signal providing circuit, coupled to a bit line of the resistive memory cell;
   a source line signal providing circuit, coupled to a source line of at least one resistive memory cell, wherein the bit line signal providing circuit provides a reference voltage to the bit line of the at least one resistive memory cell, the word line signal providing circuit provides a first voltage to the word line of the at least one resistive memory cell, and the source line signal providing circuit provides a second voltage to the source line of the at least one resistive memory cell when the at least one resistive memory cell performs a reset operation,
   wherein the first voltage is not increased while the second voltage is progressively increased.

10. The resistive memory as recited in claim 9, wherein the first voltage is a constant voltage.

11. The resistive memory as recited in claim 9, wherein the first voltage is decreased while the second voltage is progressively increased.

12. The resistive memory as recited in claim 9, wherein a sum value of the first voltage and the second voltage is a constant value.

13. The resistive memory as recited in claim 9, wherein a voltage value of the first voltage is a maximum voltage value that the resistive memory cell can receive.

* * * * *